(12) United States Patent
Kitabatake et al.

(10) Patent No.: US 6,504,176 B2
(45) Date of Patent: Jan. 7, 2003

(54) FIELD EFFECT TRANSISTOR AND METHOD OF MANUFACTURING THE SAME

(75) Inventors: Makoto Kitabatake, Nara (JP); Toshiya Yokogawa, Nara (JP); Osamu Kusumoto, Nara (JP); Masao Uchida, Osaka (JP); Kunimasa Takahashi, Osaka (JP)

(73) Assignee: Matshushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/824,922

(22) Filed: Apr. 3, 2001

(65) Prior Publication Data

US 2001/0038108 A1 Nov. 8, 2001

(30) Foreign Application Priority Data

Apr. 6, 2000 (JP) ........................................ 2000-105428

(51) Int. Cl.[7] ......................................... H01L 31/0317
(52) U.S. Cl. ......................... 257/77; 257/328; 257/329; 257/288
(58) Field of Search .......................... 257/77, 328, 330, 257/329, 332, 288; 438/105, 931

(56) References Cited

U.S. PATENT DOCUMENTS

| | | | | |
|---|---|---|---|---|
| 5,393,999 A | * | 2/1995 | Malhi | |
| 5,438,215 A | * | 8/1995 | Tihanyi | |
| 5,508,534 A | * | 4/1996 | Nakamura et al. | |
| 5,814,859 A | * | 9/1998 | Ghezzo et al. | |
| 5,831,288 A | * | 11/1998 | Singh et al. | |
| 5,963,807 A | * | 10/1999 | Ueno | |
| 5,969,378 A | * | 10/1999 | Singh | |
| 6,107,142 A | * | 8/2000 | Suvorov et al. | |

FOREIGN PATENT DOCUMENTS

JP 2001093985 * 4/2001

OTHER PUBLICATIONS

SiC Integrated MOSFETs, A Review of Fundamental Questions and Applications to Current Device Technology; Choyke et al.; Akademie Verlag, 1997, vol. II, pp. 369–388.

* cited by examiner

*Primary Examiner*—Eddie Lee
*Assistant Examiner*—Eugene Lee
(74) *Attorney, Agent, or Firm*—Merchant & Gould P.C.

(57) ABSTRACT

There are provided a field effect transistor with a high withstand voltage and low loss and a method of manufacturing the same. The field effect transistor includes an n-type substrate, an n-type semiconductor layer formed on the n-type substrate, a p-type semiconductor layer formed on the n-type semiconductor layer, a p-type region embedded in the n-type semiconductor layer, an n-type region embedded in the n-type semiconductor layer and the p-type semiconductor layer, an n-type source region disposed in the p-type semiconductor layer on its surface side, an insulating layer disposed on the p-type semiconductor layer, a gate electrode disposed on the insulating layer, a source electrode, and a drain electrode. The n-type semiconductor layer, the p-type semiconductor layer, and the p-type region are made of wide-gap semiconductors with a bandgap of at least 2 eV, respectively.

8 Claims, 9 Drawing Sheets

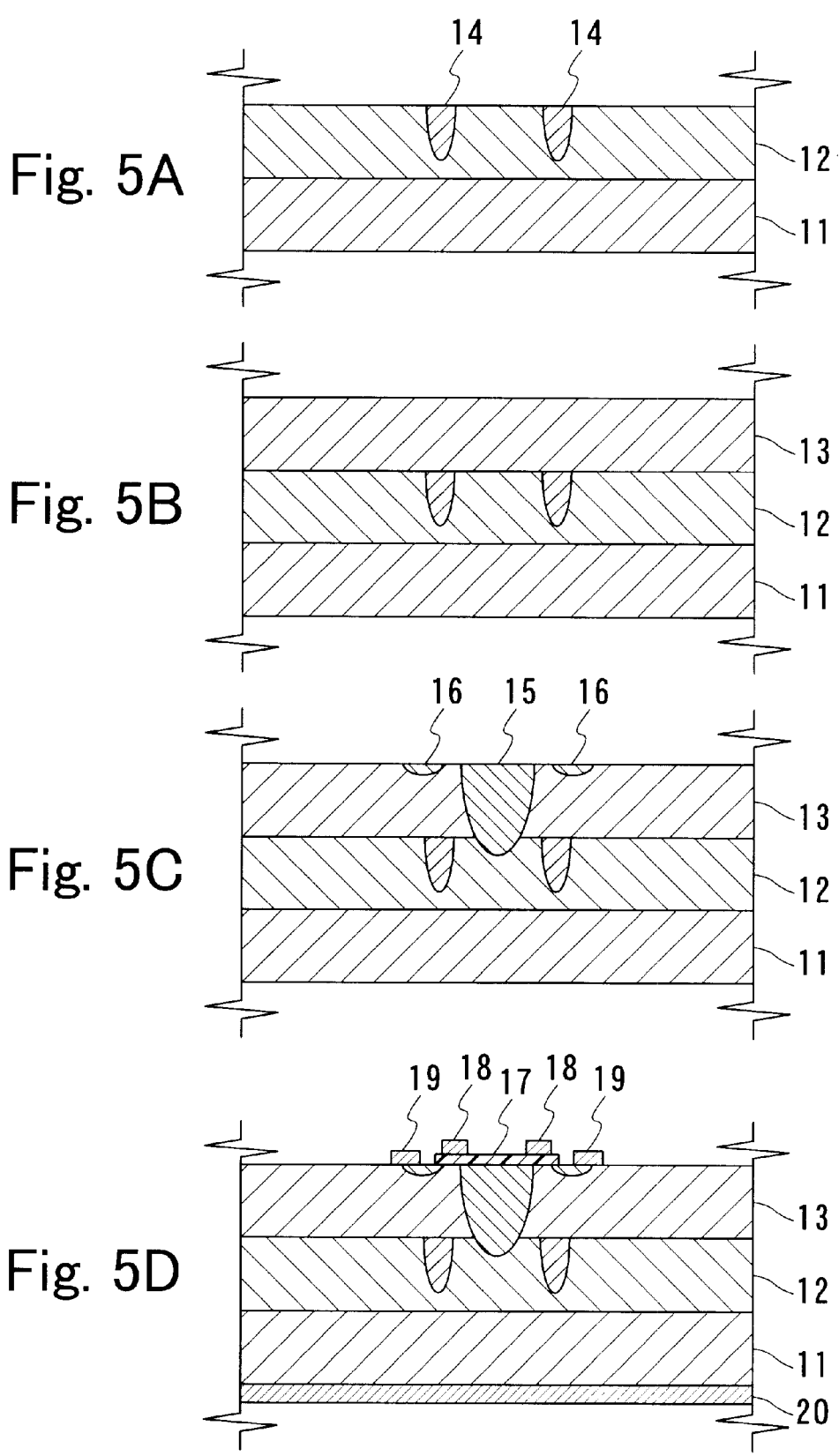

FIELD EFFECT TRANSISTOR AND METHOD OF MANUFACTURING THE SAME

BACKGROUND OF THE INVENTION

1. Field of the Invention

The present invention relates generally to a field effect transistor formed using a wide-gap semiconductor and to a method of manufacturing the same.

2. Related Background Art

Conventionally, various field effect transistors (insulated-gate semiconductor devices) have been proposed. Such field effect transistors (hereinafter also referred to as a "FET") are required to have a high withstand voltage and low loss.

A conventional FET is described by means of an example as follows. FIG. 8A shows a sectional view of a conventional FET 101 formed using Si. The FET 101 includes an n-type substrate 102, an n-type semiconductor layer 103 grown epitaxially on the substrate 102, and a p-type region 104 formed by boron implantation in the n-type semiconductor layer 103. In addition, the FET 101 also includes an n-type region 105 formed by phosphorus implantation in a part of the p-type region 104 in the vicinity of its surface, an insulating layer (a gate insulating layer) 106 formed to cover a portion of the p-type region 104 between the n-type semiconductor layer 103 adjacent to the p-type region 104 and the n-type region 105, a gate electrode 107a formed on the insulating layer 106, a source electrode 107b formed in contact with the p-type region 104 and the n-type region 105, and a drain electrode 107c formed on the rear face of the substrate 102.

In the FET 101, a bias is applied to the gate electrode 107a, so that an inversion layer is formed in the p-type region 104 and functions as a channel. In the FET 101, in order to obtain a sufficiently high withstand voltage in an off state, it is necessary to suppress a doping concentration in the n-type semiconductor layer 103 to a low level. This results in higher electrical resistance of the n-type semiconductor layer 103.

FIG. 8B shows a sectional view of a conventional FET 101a formed using SiC (silicon carbide). With reference to FIG. 8B, the FET 101a includes an n-type semiconductor layer 103 and a p-type semiconductor layer 109 grown epitaxially by a chemical vapor deposition (CVD) method sequentially on an n-type substrate 108 made of SiC. In addition, the FET 101a also includes an n$^+$ region 105a formed in a part of a surface portion of the p-type semiconductor layer 109. Thus, the FET 101a has an n$^+$/p/n layered structure. The FET 101a includes a trench T passing through the p-type semiconductor layer 109 from the surface of the n$^+$ region 105a and reaching the n-type semiconductor layer 103. The FET 101a is provided with an insulating layer (a gate insulating layer) 106 formed by oxidation of the inner wall of the trench T, a gate electrode 107a formed on the insulating layer 106, a source electrode 107b formed in contact with the n$^+$ region 105a and the p-type semiconductor layer 109, and a drain electrode 107c formed on the rear face of the substrate 108. In the FET 101a, a channel region switched on or off depending on a voltage applied to the gate electrode 107a is formed in the vicinity of the interface between the p-type semiconductor layer 109 and the insulating layer 106 where the wall surface of the trench T is formed. The details of this conventional technique are disclosed, for example, in Silicon Carbide; A Review of Fundamental Questions and Applications to Current Device Technology, edited by W. J. Choyke, H. Matsunami, and G. Pensl (Akademie Verlag, 1997, Vol. II pp.369–388).

In the FET 101, the doping concentration and thickness of the n-type semiconductor layer 103 are determined depending on the withstand voltage required for the device. Generally, in order to obtain a withstand voltage of several hundreds of voltages in a Si-MOSFET, the n-type semiconductor layer 103 is required to have a thickness of several tens of micrometers and a low doping concentration of about $10^{14}$ cm$^{-3}$. Therefore, the resistance value in an on state is significantly high. Furthermore, when a thick epitaxial layer is formed at a low doping concentration in the n-type semiconductor layer 103, there have been problems in that a longer time is required for the formation and the manufacturing cost increases.

The SiC used for the FET 101a is a non-isotropic crystal. It has been known that SiC has different oxidation rates depending on crystallographic orientations. A Si plane of an α-SiC(0001) substrate has the lowest oxidation rate. On the contrary, a C plane of an α-SiC(000-1) substrate that is obtained by a 180° rotation of the Si plane has the highest oxidation rate. When an insulating oxidation layer is formed by oxidation of the trench having planes corresponding to a plurality of different crystallographic orientations, the thickness of the insulating oxidation layer thus formed varies depending on the crystallographic orientations. Consequently, the thickness of the insulating silicon oxide layer is not uniform inside the trench and thus a nonuniform electric field is applied to the insulating layer 106 between the gate electrode and the SiC semiconductor. For instance, when the FET 101a is formed using the α-SiC(0001) substrate with the Si plane allowing an epitaxial layer with high crystallinity to be obtained, a relatively thin insulating layer 106 is formed on the wafer surface and the bottom surface of the trench T and a relatively thick insulating layer 106 is formed on the wall surface of the trench T as shown in FIG. 8B. The gate electrode 107a also is formed on the surface of the insulating layer 106 formed on the bottom surface of the trench T. As a result, a stronger electric field than that applied to the insulating layer 106 above the channel portion positioned in the vicinity of the wall surface of the trench T is applied to the insulating layer 106 formed on the bottom surface of the trench T. In such a case, the formation of the insulating layer 106 with a sufficient thickness set with consideration given to a withstand voltage for the purpose of forming a field effect transistor with a high withstand voltage results in formation of a very thick insulating layer 106 adjacent to the channel portion (a portion of the semiconductor layer in contact with the wall surface of the trench T). The formation of the thick insulating layer 106 adjacent to the channel portion, however, causes deterioration in the response performance of the device to a gate voltage, and as a result, it is required to apply a high voltage to the gate for on/off switching of the device. When the insulating layer 106 formed adjacent to the channel portion is allowed to have an optimum thickness, there has been a problem in that the thickness of the insulating layer 106 formed on the bottom surface of the trench T is reduced and thus the withstand voltage of this portion decreases. Hence, with the above-mentioned conventional technique, it has been difficult to form a power device with a high withstand voltage and high efficiency using a substrate such as the a-SiC(0001) substrate with a Si plane.

FIG. 9 shows a power MOSFET 200 disclosed in U.S. Pat. No. 5,438,215 to Tihanyi. The FET 200 includes an n-type inner region 201, a base region 203, a source region 204, a drain region 207, a plurality of p-type additional regions 211, and n-type additional regions 212 each of which is disposed two adjacent p-type additional regions 211. The additional regions 212 are doped at a higher concentration than that at which the inner region 201 is doped.

Furthermore, in the case of the FET 200, in order to form the FET 200 with a withstand voltage of several hundreds of volts to several kilovolts using a semiconductor such as Si, it is necessary to set the length of the additional regions 211 and 212 in the thickness direction A to be several tens of micrometers or longer. In order to form such additional regions 211 and 212, it is required to repeat epitaxial growth and ion implantation plural times and thus a very complicated process is necessary. In addition, there has been a problem in that the presence of a number of interfaces formed by the repetition of the epitaxial growth results in easy breakage caused by the heat history.

SUMMARY OF THE INVENTION

Therefore, with the foregoing in mind, it is an object of the present invention to provide a field effect transistor with a high withstand voltage and low loss, and a method of manufacturing the same.

In order to achieve the above-mentioned object, a field effect transistor of the present invention includes: an n-type semiconductor layer; a p-type semiconductor layer formed on the n-type semiconductor layer; a p-type region embedded in the n-type semiconductor layer to be in contact with the p-type semiconductor layer; a drain electrode electrically connected to the n-type semiconductor layer; an n-type source region disposed in contact with the p-type semiconductor layer; an insulating layer disposed adjacent to the p-type semiconductor layer; and a gate electrode disposed on the insulating layer. The n-type semiconductor layer, the p-type semiconductor layer, and the p-type region are made of wide-gap semiconductors with a bandgap of at least 2 eV, respectively. According to the field effect transistor of the present invention, a field effect transistor with a high withstand voltage and low loss can be obtained.

In the field effect transistor of the present invention, the wide-gap semiconductor m ay be SiC. According to this configuration, a power device with a high withstand voltage can be obtained in which a large current can be controlled and the physical properties of SiC such as high thermal conductivity, a high withstand voltage, and the like are reflected. Particularly, a vertical field effect transistor with a high withstand voltage, large current capacity, and low loss can be obtained by using a substrate and semiconductor layers made of SiC.

In the field effect transistor of the present invention, a substrate made of SiC further may be included. The n-type semiconductor layer may be formed on the substrate. The substrate may be one of the following substrates with a Si plane: a β-SiC(111) substrate, a 6H α-SiC(0001) substrate, a 4H α-SiC(0001) substrate, a 15R-SiC substrate, and substrates with planes obtained by off-cutting of the Si planes thereof by a tilt angle within 10 degrees. Furthermore, the substrate may be a β-SiC(100) substrate, a β-SiC(110) substrate, a 6H β-SiC(1-100) substrate, a 4H α-SiC(1-100) substrate, an α-SiC(11-20) substrate, or one of those substrates with planes obtained by off-cutting of the planes thereof by a tilt angle within 15 degrees. According to the above-mentioned configuration, since a semiconductor layer with high crystallinity can be grown epitaxially, a field effect transistor can be obtained that has good characteristics and can be manufactured easily.

In the field effect transistor of the present invention, an n-type region passing through the p-type semiconductor layer to reach the n-type semiconductor layer further may be included, The n-type source region may be disposed in a surface portion of the p-type semiconductor layer and around the n-type region. A portion of the n-type source region other than its surface may be surrounded by the p-type semiconductor layer. The gate electrode may be disposed in a place corresponding to that of a portion of the p-type semiconductor layer between the n-type region and the n-type source region with the insulating layer interposed between the gate electrode and the portion of the p-type semiconductor layer. In addition, the p-type region may be disposed around the n-type region. With this configuration, a field effect transistor with a particularly high withstand voltage and low loss can be obtained.

In the field effect transistor of the present invention, a trench passing through the p-type semiconductor layer to reach the n-type semiconductor layer further may be included. The insulating layer may be disposed on at least a side wall of the trench. The n-type source region may be disposed in a surface portion of the p-type semiconductor layer and around the insulating layer. Furthermore, the p-type region may be disposed around the trench. With this configuration, a field effect transistor with a particularly high withstand voltage and low loss can be obtained.

In the field effect transistor of the present invention, the insulating layer disposed on the side wall may have a mean thickness not exceeding 500 nm.

In the field effect transistor of the present invention, a total of a mean thickness of the n-type semiconductor layer and a mean thickness of the p-type semiconductor layer may not exceed 20 μm. The above-mentioned configuration allows the field effect transistor to be manufactured particularly easily.

In the field effect transistor of the present invention, the p-type region may have a depth not exceeding 10 μm. The above-mentioned configuration allows the field effect transistor to be manufactured particularly easily.

A method of manufacturing a field effect transistor, which is provided with an n-type semiconductor layer and a p-type semiconductor layer formed on the n-type semiconductor layer, of the present invention includes: a first process of forming the n-type semiconductor layer on an n-type substrate; a second process of forming a p-type region extending inward from a surface of the n-type semiconductor layer by doping a part of the n-type semiconductor layer; and a third process of forming the p-type semiconductor layer on the n-type semiconductor layer. The n-type semiconductor layer, the p-type semiconductor layer, and the p-type region are made of wide-gap semiconductors with a bandgap of at least 2 eV, respectively. According to the manufacturing method of the present invention, a field effect transistor of the present invention having a high withstand voltage and low loss can be manufactured easily.

In the manufacturing method of the present invention, the following processes further may be included after the third process: a fourth process of forming an n-type region and an n-type source region by doping parts of the p-type semiconductor layer so that the n-type region passes through the p-type semiconductor layer to reach the n-type semiconductor layer, the n-type source region being disposed in a surface portion of the p-type semiconductor layer and formed around the n-type region, and a portion of the n-type source region other than its surface being surrounded by the p-type semiconductor layer; a fifth process of forming an insulating layer to cover a portion of the p-type semiconductor layer between the n-type region and the n-type source region; and a sixth process of forming a gate electrode to be disposed on the insulating layer, a source electrode to be disposed in contact with the n-type source region, and a drain electrode to be disposed on the rear face of the substrate.

In the manufacturing method of the present invention, the following processes further may be included after the third process: a fourth process of forming an n-type source region in a surface portion of the p-type semiconductor layer by doping a part of the p-type semiconductor layer; a fifth process of forming a trench to pass through the p-type semiconductor layer to reach the n-type semiconductor layer by etching a center portion of the n-type source region from a surface side of the p-type semiconductor layer so that the trench reaches the n-type semiconductor layer, and forming an insulating layer on an inner wall of the trench; and a sixth process of forming a gate electrode to be disposed inside the insulating layer, a source electrode to be disposed in contact with the n-type source region, and a drain electrode to be disposed on the rear face of the substrate.

In the manufacturing method of the present invention, the following processes further may be included after the third process: a fourth process of forming an n-type source region made of an n-type semiconductor on the p-type semiconductor layer; a fifth process of forming a trench to pass through the p-type semiconductor layer to reach the n-type semiconductor layer by etching a center portion of the n-type source region from a surface side of the n-type source region so that the trench reaches the n-type semiconductor layer, and forming an insulating layer on an inner wall of the trench; and a sixth process of forming a gate electrode to be disposed inside the insulating layer, a source electrode to be disposed in contact with the n-type source region, and a drain electrode to be disposed on the rear face of the substrate.

BRIEF DESCRIPTION OF THE DRAWINGS

FIG. 5A to 5D show processes in an example of a method of manufacturing a field effect transistor according to the present invention.

DETAILED DESCRIPTION OF THE INVENTION

Examples of embodiments according to the present invention are described with reference to the drawings as follows.

A field effect transistor of the present invention includes: an n-type semiconductor layer; a p-type semiconductor layer formed on the n-type semiconductor layer; a p-type region embedded in the n-type semiconductor layer to be in contact with the p-type semiconductor layer; a drain electrode electrically connected to the n-type semiconductor layer; an n-type source region disposed in contact with the p-type semiconductor layer; an insulating layer disposed adjacent to the p-type semiconductor layer; and a gate electrode disposed on the insulating layer. The n-type semiconductor layer, the p-type semiconductor layer, and the p-type region may be made of wide-gap semiconductors with a bandgap of at least 2 eV, respectively.

A method of manufacturing a field effect transistor, which is provided with an n-type semiconductor layer and a p-type semiconductor layer formed on the n-type semiconductor layer, of the present invention includes: a first process of forming the n-type semiconductor layer on an n-type substrate; a second process of forming a p-type region extending inward from the surface of the n-type semiconductor layer by doping a part of the n-type semiconductor layer; and a third process of forming the p-type semiconductor layer on the n-type semiconductor layer. The n-type semiconductor layer, the p-type semiconductor layer, and the p-type region may be made of wide-gap semiconductors with a bandgap of at least 2 eV, respectively.

The following descriptions are directed to specific examples of the embodiments.

Embodiment 1

Figure 1A:
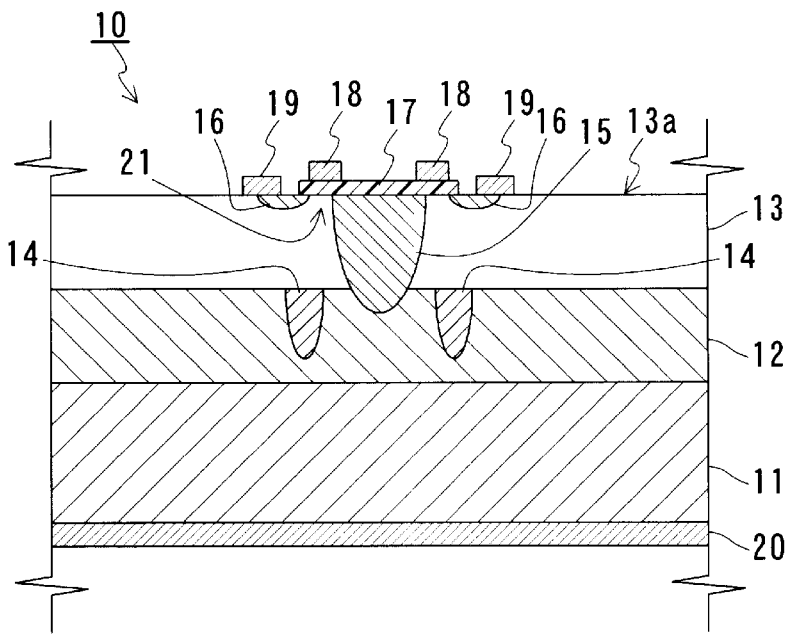
FIGS. 1A and 1B are a sectional view and a functional diagram of an example of a field effect transistor according to the present invention, respectively.

In Embodiment 1, the description is directed to an example of a field effect transistor according to the present invention. FIG. 1A shows a sectional view of a field effect transistor 10 (hereinafter also referred to as a "FET" 10) according to Embodiment 1.

With reference to FIG. 1A, the FET 10 includes an n-type substrate 11, an n-type semiconductor layer 12 formed on the substrate 11, and a p-type semiconductor layer 13 (shown with hatching omitted) formed on the n-type semiconductor layer 12. In addition, the FET 10 also includes a p-type region 14 embedded in the n-type semiconductor layer 12, an n-type region 15 embedded in the n-type semiconductor layer 12 and the p-type semiconductor layer 13, an n-type source region 16 disposed in the p-type semiconductor layer 13 on its surface side, an insulating layer (a gate insulating layer) 17 disposed on the p-type semiconductor layer 13, a gate electrode 18 disposed on the insulating layer 17, a source electrode 19, and a drain electrode 20. The n-type semiconductor layer 12, the p-type semiconductor layer 13, and the p-type region 14 may be made of wide-gap semiconductors with a bandgap Eg of at least 2 eV (preferably 2.5≦Eg), respectively. For instance, silicon carbide (SiC) can be used as the wide-gap semiconductor. In addition, a group III nitride compound semiconductor (for example GaN) containing nitrogen and at least one element selected from Ga, In, and Al also can be used.

An n-type SiC substrate or an n-type group III nitride compound semiconductor substrate can be used as the n-type substrate 11. Specifically, one of the following substrates with a Si plane can be used as the n-type substrate 11: a β-SiC(111) substrate, a 6H α-SiC (0001) substrate, a 4H α-SiC (0001) substrate, a 15R-SiC substrate, and substrates with planes obtained by off-cutting the Si planes thereof by a tilt angle within 10 degrees. In addition, one of the following substrate also can be used: a β-SiC(100) substrate, a β-SiC(110) substrate, a 6H α-SiC (1-100) substrate, a 4H α-SiC (1-100) substrate, an a-SiC (11-20) substrate, and substrates with planes obtained by off-cutting planes thereof by a tilt angle within 15 degrees. The use of such a substrate allows a SiC layer with high crystallinity easily to grow epitaxially and thus a smooth surface can be obtained.

An n-type SiC or n-type group III nitride compound semiconductor can be used for the n-type semiconductor layer 12. A p-type SiC or p-type group III nitride compound semiconductor can be used for the p-type semiconductor layer 13. The n-type semiconductor layer 12 has a thickness, for example, in the range of 1 $\mu$m to 100 $\mu$m. The p-type semiconductor layer 13 has a thickness, for example, in the range of 0.5 $\mu$m to 10 $\mu$m. In the FET 10, since the n-type semiconductor layer 12 and the p-type semiconductor layer 13 are made of wide-gap semiconductors, respectively, the n-type semiconductor layer 12 and the p-type semiconductor layer 13 can be formed to be thin (the same holds true in the following embodiments). For instance, the total of mean thicknesses of the n-type semiconductor layer 12 and the p-type semiconductor layer 13 can be set not to exceed 20 $\mu$m. Hence, it is not necessary to repeat epitaxial growth and ion implantation plural times. Accordingly, a highly reliable FET can be obtained that can be manufactured easily.

Figure 2A:
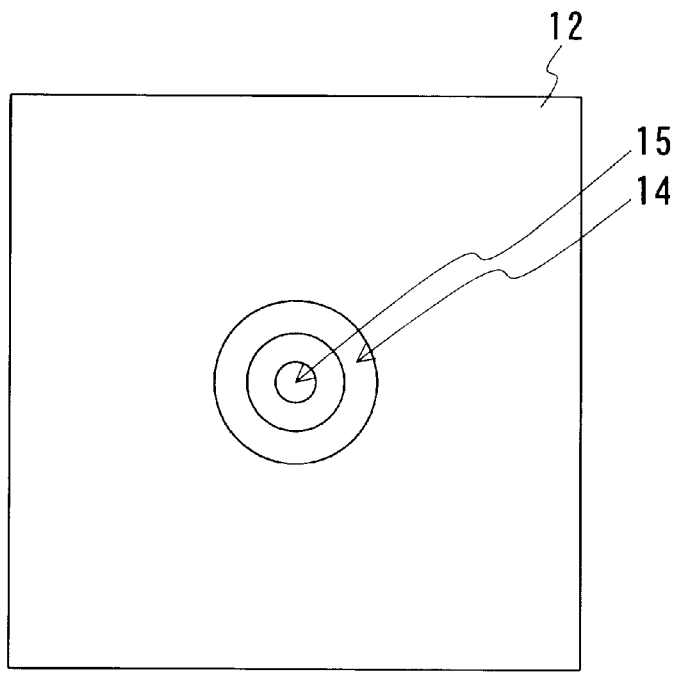
FIGS. 2A and 2B show a sectional view in a part and a plan view in another part of the field effect transistor shown in FIG. 1A.

The p-type region 14 has, for example, an annular shape such as a doughnut shape or a hexagonal shape with an opening in its center. The p-type region 14 is embedded in the n-type semiconductor layer 12 to be in contact with the p-type semiconductor layer 13. The p-type region 14 and the p-type semiconductor layer 13 have electrical continuity therebetween. The thickness of the p-type region 14 is, for example, in the range of 1 $\mu$m to 10 $\mu$m. FIG. 2A shows a sectional view of the interface between the n-type semiconductor layer 12 and the p-type semiconductor layer 13 in the case where the p-type region 14 has a doughnut shape, viewed from the p-type semiconductor layer 13 side (with hatching omitted). As shown in FIG. 2A, the p-type region 14 is formed in a place surrounding the n-type region 15 but being not in contact with the n-type region 15. The p-type region 14 can be formed by doping of a part of the n-type semiconductor layer 12 and is made of SiC, a group III nitride compound semiconductor, or the like. In the FET of the present invention, the n-type semiconductor layer 12 with the p-type region 14 embedded therein has a substantially uniform dopant concentration. Specifically, it is preferable that the value of variation in dopant concentration in the n-type semiconductor layer 12 does not exceed a value indicated with one digit. It is not necessary to allow the n-type semiconductor layer 12 to have a specially high dopant concentration.

The n-type region 15 passes through the p-type semiconductor layer 13 to reach a portion of the n-type semiconductor layer 12 located at the center of the annular p-type region 14. The n-type region 15 can be formed by doping of a part of the n-type semiconductor layer 12 and the p-type semiconductor layer 13. The n-type region 15 is made of SiC, a group III nitride compound semiconductor, or the like.

Figure 2B:
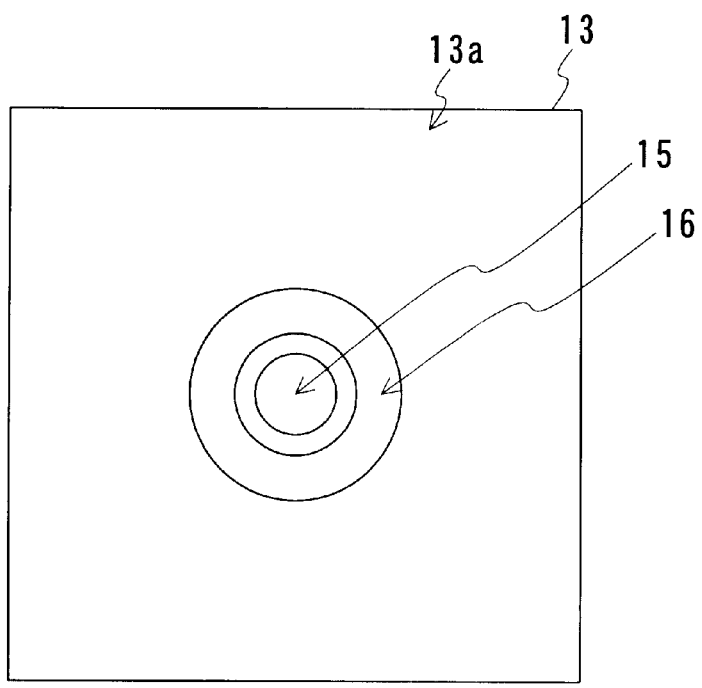

The n-type source region 16 is formed in the vicinity of a surface 13a of the p-type semiconductor layer 13 surrounding the n-type region 15 so as not to be in contact with the n-type region 15. In other words, the n-type source region 16 is formed in a surface portion of the p-type semiconductor layer 13 surrounding the n-type region 15 and the portion of the n-type source region 16 other than its surface is surrounded by the p-type semiconductor layer 13. The n-type source region 16 can be formed by doping of a part of the p-type semiconductor layer 13 at a high concentration and is made of SiC, a group III nitride compound semiconductor, or the like. The n-type source region 16 has, for instance, an annular shape. FIG. 2B shows a plan view of the surface 13a of the p-type semiconductor layer 13 according to an example when the n-type source region 16 has a doughnut shape.

The insulating layer 17 is disposed on the p-type semiconductor layer 13 so as to cover at least a part of the surface 13a of the p-type semiconductor layer 13 located in a place sandwiched between the n-type region 15 and the n-type source region 16. The insulating layer 17 can be formed of, for instance, an insulating oxide such as silicon oxide or aluminum oxide, ferroelectric substance, or insulating nitride.

The gate electrode 18 is disposed in a place corresponding to that of a portion of the p-type semiconductor layer 13 between the n-type region 15 and the n-type source region 16 with the insulating layer 17 interposed between the gate electrode 18 and the portion of the p-type semiconductor layer 13. The source electrode 19 is disposed to be in contact with both the p-type semiconductor layer 13 and the n-type source region 16. The drain electrode 20 is formed on the rear face of the substrate 11. The drain electrode 20 is connected with the n-type semiconductor layer 12 to have electrical continuity therewith, i.e. to have a substantial ohmic contact therewith. In the FET 10, the portion (between the n-type region 15 and the n-type source region 16) of the p-type semiconductor layer 13 located in a place corresponding to that of the gate electrode 18 functions as a channel region 21.

Figure 1B:
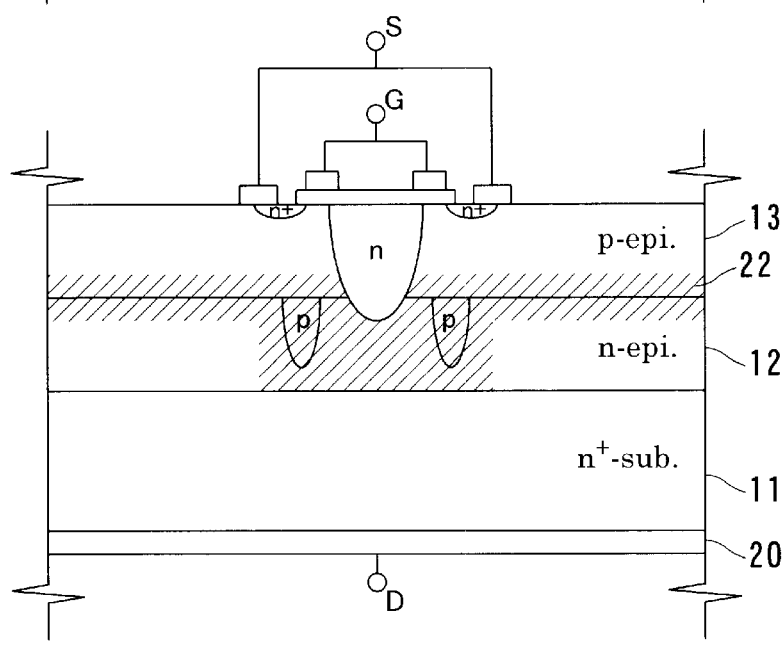

In the FET 10, electrons flow through a path defined by the source electrode 19—the n-type source region 16—the channel region 21—the n-type region 15—the n-type semiconductor layer 12—the substrate 11—the drain electrode 20. When the FET 10 is in an off state, the voltage applied between the source electrode 19 and the drain electrode 20 is a reverse bias to a p-n junction formed between the n-type semiconductor layer 12 and both the p-type semiconductor layer 13 and the p-type region 14. FIG. 1B schematically shows a depletion region 22 (shown with hatching in FIG. 1B) formed in the FET 10.

In the FET 10, the p-n junction is formed between the n-type semiconductor layer 12 and the p-type region 14. Therefore, the depletion region 22 occurs and spreads around the p-type region 14. This provides the same effect in the off state as that obtained when an insulating layer is present between the n-type region 15 and the drain electrode 20, and thus allows a significant electric potential drop to be achieved between the n-type region 15 and the drain electrode 20. Accordingly, this electric potential drop reduces the potential difference between the n-type region 15 and the gate electrode 18. Thus, the electric field applied to the insulating layer 17 in the off state of the FET 10 is weakened and thereby the withstand voltage of the FET 10 increases. Furthermore, the depletion region 22 in the off state is formed in a sufficiently thick portion of the n-type semiconductor layer 12. Therefore, a high withstand voltage can be maintained even when the doping concentration in the n-type region 15 embedded in the p-type semiconductor layer 13 is increased. The doping of the n-type region 15 at a high concentration allows electrical resistance in an on state to be reduced and loss in the FET 10 to be reduced accordingly.

As described above, according to the FET 10, a field effect transistor with a high withstand voltage and low loss can be obtained. Since the n-type semiconductor layer 12, the p-type region 14, and the p-type semiconductor layer 13 can be formed to be thin in the FET 10, the FET 10 can be manufactured easily. Moreover, when a plurality of field effect transistors produced according to the present invention are formed in a matrix form, a power MOSFET can be obtained that can control a high current and voltage.

Embodiment 2

In Embodiment 2, the description is directed to another example of a field effect transistor according to the present invention. The parts identical with those in Embodiment 1 are indicated with the same numerals and the duplicate descriptions will be omitted (the same holds true in the following embodiments).

Figure 3A:
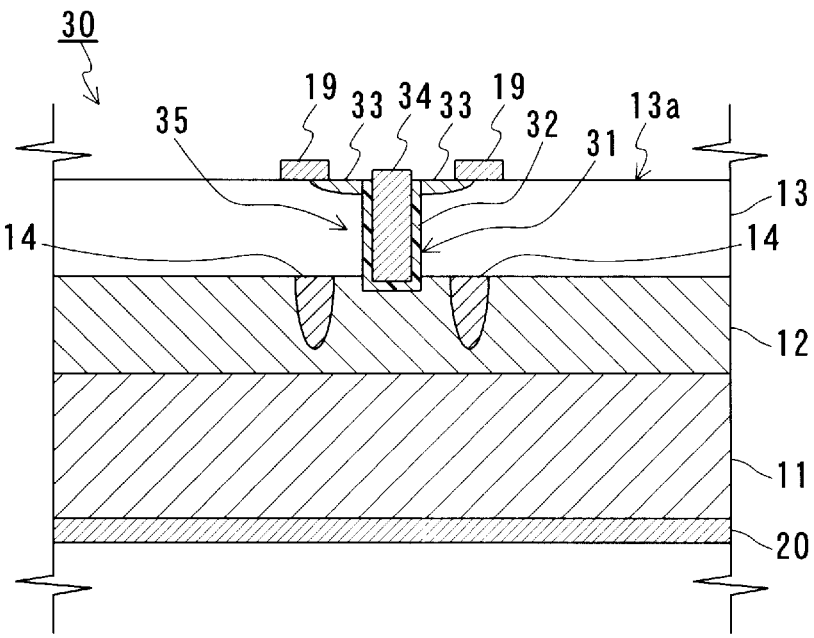
FIGS. 3A and 3B are a sectional view and a functional diagram of another example of a field effect transistor according to the present invention, respectively.

FIG. 3A shows a sectional view of a FET 30 according to Embodiment 2. With reference to FIG. 3A, the FET 30 includes an n-type substrate 11, an n-type semiconductor layer 12 formed on the substrate 11, and a p-type semiconductor layer 13 (shown with hatching omitted) formed on the n-type semiconductor layer 12. In addition, the FET 30 includes a p-type region 14 embedded in the n-type semiconductor layer 12, a trench 31 passing through the p-type semiconductor layer 13 to reach the n-type semiconductor layer 12, an insulating layer 32 disposed on the inner wall of the trench 31, an n-type source region 33 disposed in the p-type semiconductor layer 13 on its surface 13a side, a gate electrode 34, a source electrode 19, and a drain electrode 20.

The trench 31 is a groove passing through the p-type semiconductor layer 13 to reach the n-type semiconductor layer 12. The p-type region 14 is embedded in the n-type semiconductor layer 12 to be in contact with the p-type semiconductor layer 13. In addition, the p-type region 14 is disposed around the trench 31.

The insulating layer 32 is disposed on at least a side wall 31b (see FIG. 6B) of the trench 31. In other words, the insulating layer 32 is disposed adjacent to the p-type semiconductor layer 13. In the FET 30, the insulating layer 32 on the side wall 31b can be formed to be thinner. The mean thickness of the insulating layer 32 on the side wall 31b is changed depending on the required characteristics, but can be, for example, in the range of 10 nm to 1000 nm (preferably, 10 nm to 500 nm). The reduction in thickness of the insulating layer 32 on the side wall 3 lb allows a device with a high speed of response to be obtained. The gate electrode 34 is disposed on the insulating layer 32.

The n-type source region 33 is disposed in the p-type semiconductor layer 13 on its surface 13a side and around the insulating layer 32 and is in contact with the p-type semiconductor layer 13.

In FET 30, a portion of the p-type semiconductor layer 13 located around the side wall of the trench 31 functions as a channel region 35. In FET 30, electrons flow through a path defined by the source electrode 19 the n-type source region 33—the channel region 35—the n-type semiconductor layer 12—the substrate 11—the drain electrode 20.

Figure 3B:
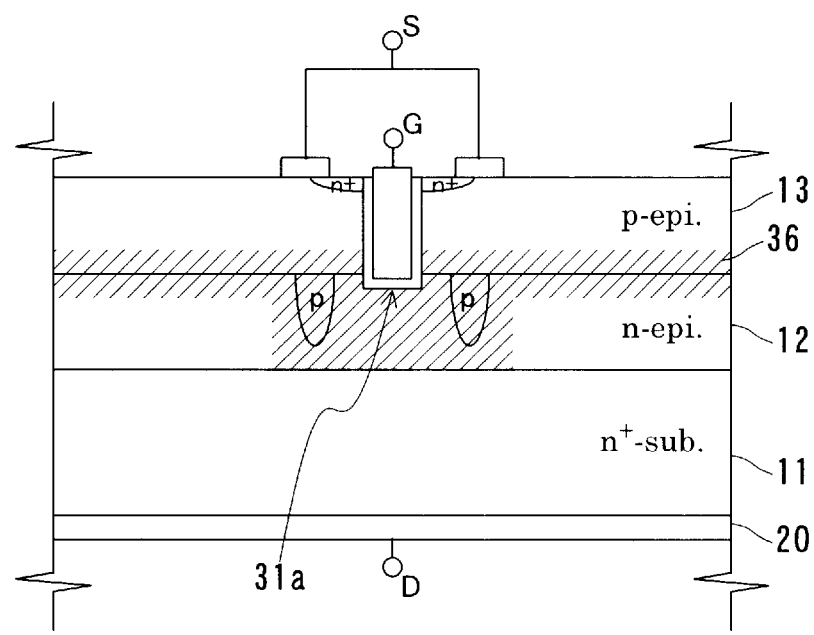

When the FET 30 is in an off state, the voltage applied between the source electrode 19 and the drain electrode 20 is a reverse bias to a p-n junction formed between the n-type semiconductor layer 12 and both the p-type semiconductor layer 13 and the p-type region 14. FIG. 3B schematically shows a depletion region 36 (shown with hatching in FIG. 3B) formed in the FET 30.

In the FET 30, the p-n junction is formed between the n-type semiconductor layer 12 and the p-type region 14. Therefore, the depletion region 36 occurs and spreads around the p-type region 14. This provides the same effect in the off state as that obtained when an insulating layer is present between the drain electrode 20 and the n-type semiconductor layer 12 directly under a bottom surface 31a of the trench 31, and thus allows a significant electric potential drop to be achieved between the bottom surface 31a and the drain electrode 20. Accordingly, this electric potential drop reduces the potential difference between the bottom surface 31a and the gate electrode 34. Thus, the electric field applied to the insulating layer 32 in the off state of the FET 30 is weakened and thereby the withstand voltage of the FET 30 is increased.

As described above, according to the FET 30, a field effect transistor with a high withstand voltage and low loss can be obtained. Moreover, when a plurality of FETs 30 are formed in a matrix form, a power MOSFET can be obtained that can control a high current and voltage.

Embodiment 3

In Embodiment 3, the description is directed to another example of a field effect transistor according to the present invention.

Figure 4A:
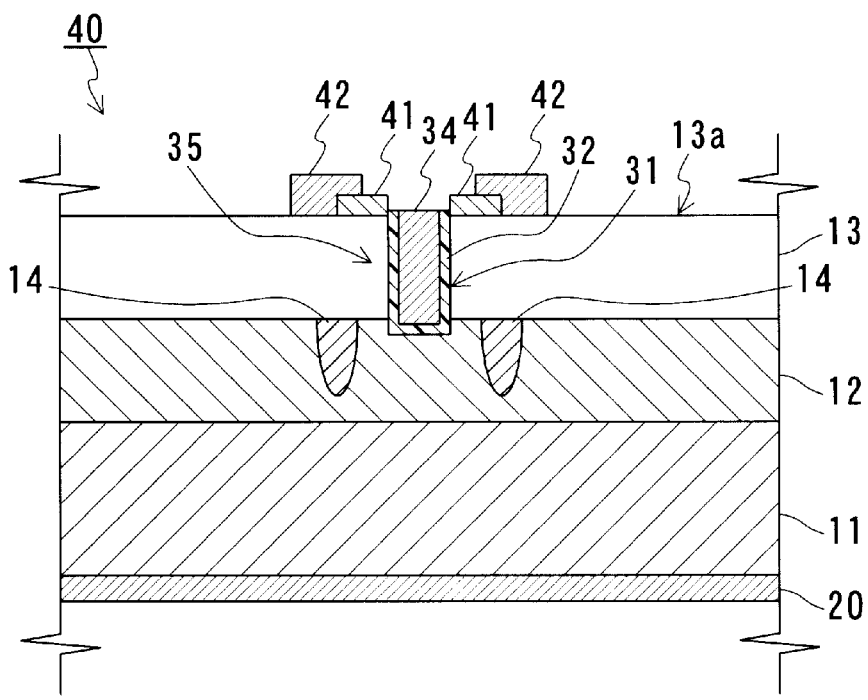
FIGS. 4A and 4B are a sectional view and a functional diagram of still another example of a field effect transistor according to the present invention, respectively.

FIG. 4A shows a sectional view of a FET 40 according to Embodiment 3. With reference to FIG. 4A, the FET 40 includes an n-type substrate 11, an n-type semiconductor layer 12 formed on the substrate 11, and a p-type semiconductor layer 13 (shown with hatching omitted) formed on the n-type semiconductor layer 12. In addition, the FET 40 also includes a p-type region 14 embedded in the n-type semiconductor layer 12, a trench 31 passing through the p-type semiconductor layer 13 to reach the n-type semiconductor layer 12, an insulating layer 32 disposed on the inner wall of the trench 31, an n-type source region 41 disposed on the p-type semiconductor layer 13, a gate electrode 34, a source electrode 42, and a drain electrode 20.

The trench 31 is a groove passing through the p-type semiconductor layer 13 to reach the n-type semiconductor layer 12. The p-type region 14 is disposed around the trench 31.

The insulating layer 32 is formed on the inner wall of the trench 31. In the FET 40, the insulating layer 32 on the side wall 31b (see FIG. 7B) can be formed to be thinner. The mean thickness of the insulating layer 32 on the side wall 31b is changed depending on the required characteristics, but can be, for example, in the range of 10 nm to 1000 nm (preferably, 10 nm to 500 nm). The reduction in thickness of the insulating layer 32 on the side wall 31b allows a device with a high speed of response to be obtained. The gate electrode 34 is disposed on the insulating layer 32.

The n-type source region 41 is disposed on the p-type semiconductor layer 13 and around an opening of the trench 31. The source electrode 42 is disposed in contact with the n-type source region 41.

Figure 4B:
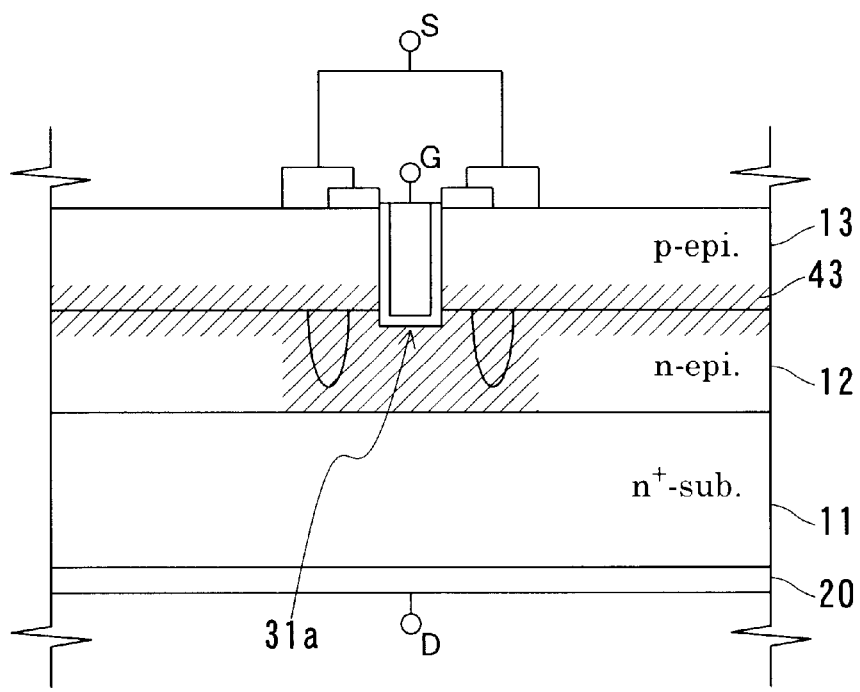

When the FET 40 is in an off state, the voltage applied between the source electrode 42 and the drain electrode 20 is a reverse bias to a p-n junction formed between the n-type semiconductor layer 12 and both the p-type semiconductor layer 13 and the p-type region 14. FIG. 4B schematically shows a depletion region 43 (shown with hatching in FIG. 4B) formed in the FET 40.

According to the FET 40 of Embodiment 3 described above, a field effect transistor with a high withstand voltage and low loss can be obtained as in the case of the FET 30.

Embodiment 4

In Embodiment 4, the description is directed to an example of a method of manufacturing a field effect transistor according to the present invention.

Figure 6A:
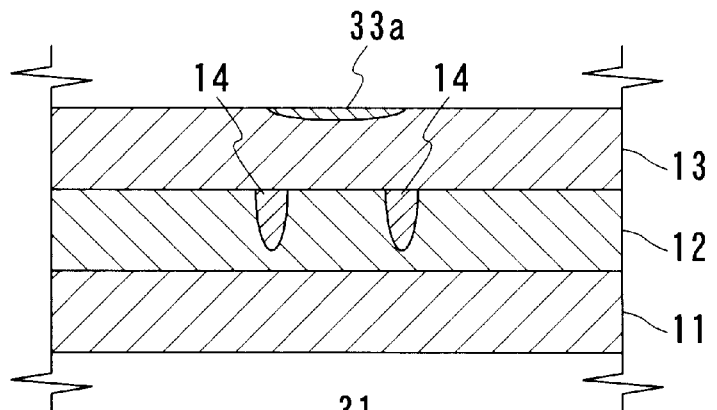
FIGS. 6A to 6D show processes in another example of a method of manufacturing a field effect transistor according to the present invention.

FIGS. 5A to 5D show manufacturing processes in the manufacturing method according to Embodiment 4. In the manufacturing method of Embodiment 4, initially, an n-type semiconductor layer 12 is formed on an n-type substrate 11 as shown in FIG. 6A (Process 1). Then, a part of the n-type semiconductor layer 12 is doped with boron or the like, so that a p-type region 14 is formed to extend inward from the surface of the n-type semiconductor layer 12 (Process 2). The substrates described in Embodiment 1 can be used as the substrate 11. For instance, an n⁺-type α-SiC substrate cleaved in the (0001) Si plane can be used. The n-type semiconductor layer 12 can be formed through epitaxial growth of an n-type semiconductor layer on the substrate 11 by a CVD, sublimation epitaxy, or molecular beam epitaxial (MBE) process or the like. Since the n-type semiconductor layer 12 is thin, it is not necessary to repeat epitaxial growth and ion implantation plural times to form the n-type semiconductor layer 12 and the p-type region 14.

Afterward, as shown in FIG. 5B, a p-type semiconductor layer 13 is formed on the n-type semiconductor layer 12 (Process 3). The p-type semiconductor layer 13 is allowed to grow epitaxially by the same method as in the case of the n-type semiconductor layer 12.

Then, as shown in FIG. 5C, parts of the p-type semiconductor layer 13 are doped with phosphorus, nitrogen, or the like, so that an n-type region 15 and an n-type source region 16 are formed (Process 4). The n-type region 15 passes through the p-type semiconductor layer 13 to reach the n-type semiconductor layer 12. The n-type source region 16 is disposed in a surface portion of the p-type semiconductor layer 13 and around the n-type region 15.

Next, as shown in FIG. 5D, an insulating layer 17 is formed on the p-type semiconductor layer 13 to cover at least a portion of the p-type semiconductor layer 13 between the n-type region 15 and the n-type source region 16 (Process 5). Furthermore, a gate electrode 18 is formed to be disposed on the insulating layer 17, a source electrode 19 to be disposed to be in contact with the n-type source region 16, and a drain electrode 20 to be disposed on the rear face of the substrate 11 (Process 6). Thus, a field effect transistor can be produced. The insulating layer 17 is formed by oxidation of the substrate 11 with semiconductor layers formed thereon, so that an insulating oxidation layer is formed, with removal of an unwanted part of the layer. The insulating layer 17 also may be formed by the CVD method or the like.

In the above-mentioned process, the doping can be carried out by, for example, ion implantation. In the case of doping by the ion implantation, preferably, it is carried out as follows.

That is, it is preferable that the ion implantation is carried out with an ion-implantation energy in the range of 1 keV to 10 MeV (the same holds true in the following embodiments). When the energy is in the above-mentioned range, conventional ion implantation equipment can be used and a dopant region with a depth of about 10 nm to several micrometers can be formed easily. When the ion-implantation energy is 1 keV or lower, the n-type region 15 and the n-type source region 16 cannot be formed to have sufficient thicknesses and thus the withstand voltage of the device is reduced. In addition, it is not easy to carry out the ion implantation with a higher energy than 10 MeV in terms of the equipment.

When the p-type region 14 and the n-type region 15 are to be formed, it is preferable to implant ions with at least two different energy levels in a multiplex manner in carrying out the ion implantation (the same holds true in the following embodiments). This allows a box-shaped implantation region to be formed to have a dopant distribution with less nonuniformity in the depth direction.

Preferably, the ion energy used in forming the n-type region 15 is higher than that used in forming the n-type source region 16. This allows the n-type region 15 to be formed deeply and thus the electrical continuity between the n-type region 15 and the n-type semiconductor layer 12 can be improved. Hence, according to the above-mentioned configuration, the resistance in the on state is reduced and thus a field effect transistor with low loss can be obtained.

Preferably, the ion dose used when the n-type region 15 and the n-type source region 16 are formed by ion plantation is at least $10^{14}$ cm$^{-2}$ (the same holds true in the following embodiments). A dose of $10^{14}$ cm$^{-2}$ or more can prevent the resistance of the n-type region 15 and the n-type source region 16 from increasing.

When ion implantation is carried out in the above-mentioned process, it is preferable that the temperature of the substrate 11 is maintained at 300° C. or higher (the same holds true in the following embodiments). This allows lattice defects caused by ion bombardment to be annealed to some degree during the ion implantation and thus activation of the dopant after the heat treatment can be accelerated.

According to the manufacturing method of Embodiment 4, the FET 10 described in Embodiment 1 can be manufactured easily. In the above-mentioned manufacturing method, the channel region (see the channel region 21 shown in FIG. 1) formed in the surface portion of the p-type semiconductor layer 13 is not damaged by the ion bombardment or etching during the process. Therefore, a field effect transistor with good characteristics can be manufactured.

Embodiment 5

In Embodiment 5, the description is directed to another example of a method of manufacturing a field effect transistor according to the present invention. With respect to the same processes as in Embodiment 4, the duplicate descriptions will be omitted (the same holds true in the following embodiment).

FIGS. 6A to 6D show manufacturing processes in the manufacturing method according to Embodiment 5. In the manufacturing method of Embodiment 5, initially, as shown in FIG. 6A, an n-type semiconductor layer 12 is formed on an n-type substrate 11 (Process 1). Then, a part of the n-type semiconductor layer 12 is doped with boron or the like, so that a p-type region 14 is formed to extend inward from the surface of the n-type semiconductor layer 12 (Process 2). Subsequently, a p-type semiconductor layer 13 is formed on the n-type semiconductor layer 12 (Process 3). As a next step, a part of the p-type semiconductor layer 13 is doped with phosphorus, nitrogen, or the like, so that an n-type source region 33a is formed in the surface portion of the p-type semiconductor layer 13 (Process 4). The n-type source region 33a may be formed in an annular shape with an opening in its center.

Figure 6B:
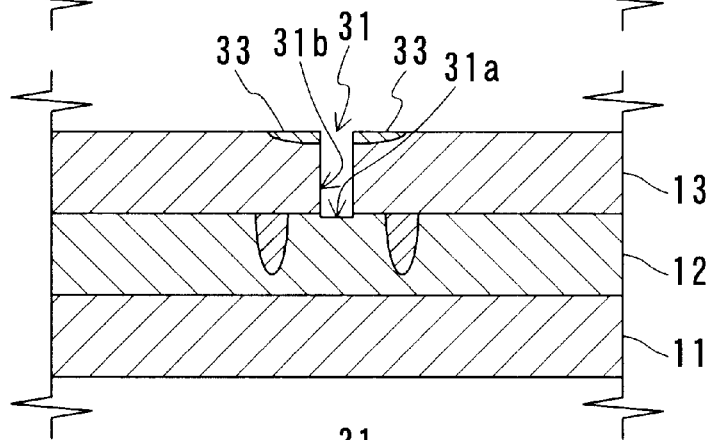
Figure 6C:
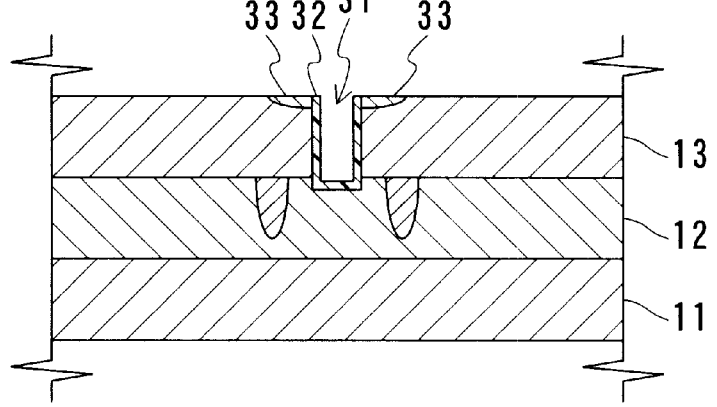

Afterward, as shown in FIG. 6B, the center portion of the n-type source region 33a is etched from the surface side of the p-type semiconductor layer 13, so that a trench 31 is formed to pass through the p-type semiconductor layer 13 to reach the n-type semiconductor layer 12, and further an insulating layer 32 is formed on the inner wall of the trench 31 as shown in FIG. 6C (Process 5). The trench 31 can be formed by, for example, dry etching such as reactive ion etching (RIE) or inductively coupled plasma (ICP) etching. The insulating layer 32 can be formed by, for example, wet oxidation, dry oxidation, or hydrogen-burning oxidation. In addition, the insulating layer 32 also can be formed by deposition of oxide (for example, aluminum oxide) or nitride by a vapor deposition method or a CVD method.

Figure 6D:
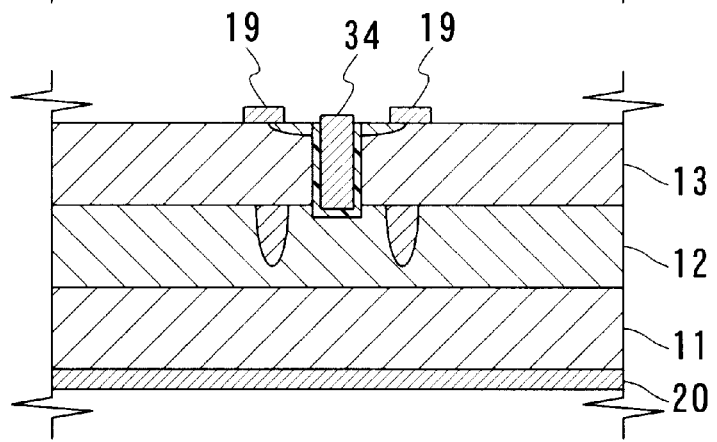

Then, as shown in FIG. 6D, a gate electrode 34 is formed to be disposed on the insulating layer 32, a source electrode 19 to be disposed to be in contact with the n-type source region 33, and a drain electrode 20 to be disposed on the rear surface of the substrate 11 (Process 6). Thus, a field effect transistor can be manufactured.

According to the manufacturing method of Embodiment 5, the FET 30 described in Embodiment 2 can be manufactured easily.

Embodiment 6

In Embodiment 6, the description is directed to still another example of a method of manufacturing a field effect transistor according to the present invention.

Figure 7A:
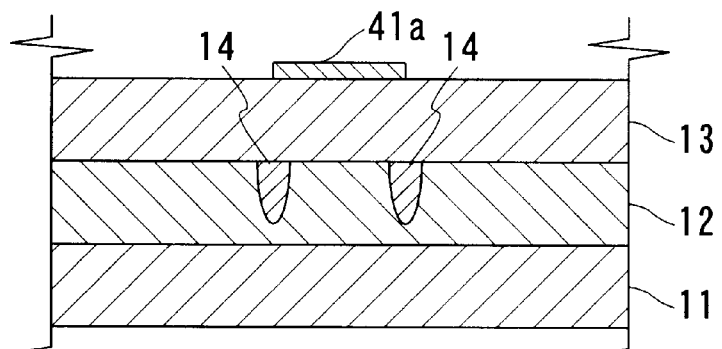
FIGS. 7A to 7D show processes in still another example of a method of manufacturing a field effect transistor according to the present invention.

FIGS. 7A to 7D show manufacturing processes in the manufacturing method according to Embodiment 6. In the manufacturing method according to Embodiment 6, initially, as shown in FIG. 7A, an n-type semiconductor layer 12 is formed on a substrate 11 (Process 1). Then, a part of the n-type semiconductor layer 12 is doped with boron or the like, so that a p-type region 14 is formed to extend inward from the surface of the n-type semiconductor layer 12 (Process 2). Subsequently, a p-type semiconductor layer 13 is formed on the n-type semiconductor layer 12 (Process 3). Afterward, an n-type source region 41a is formed on a part of the p-type semiconductor layer 13 (Process 4). The n-type source region 41a may be formed in an annular shape with an opening in its center. The n-type source region 41a can be formed through epitaxial growth of an n-type semiconductor layer with a high dopant concentration and removal of its unwanted portion by photolithographic and etching processes.

Figure 7B:
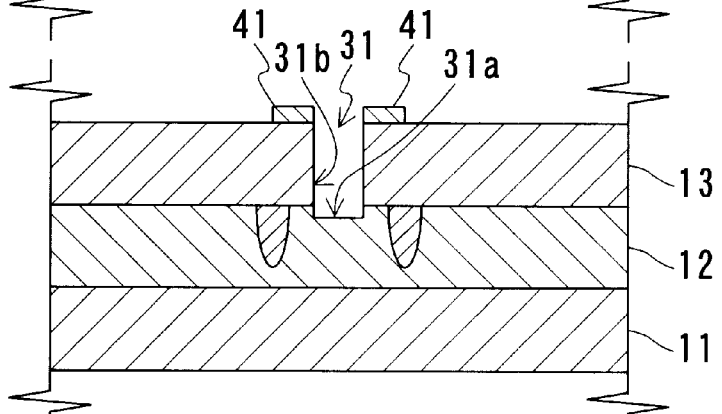
Figure 7C:
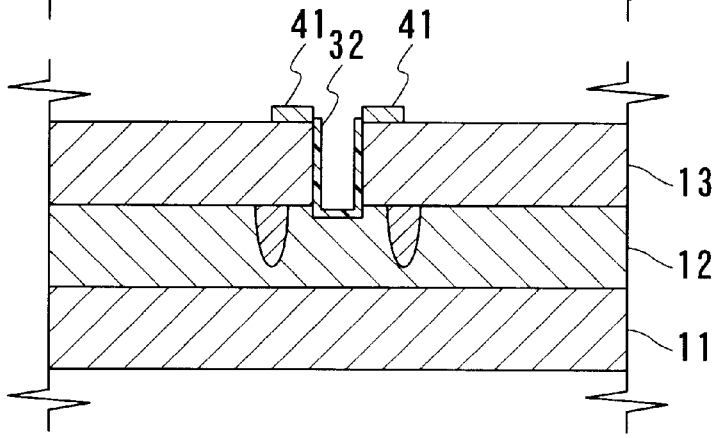

Afterward, as shown in FIG. 7B, the center portion of the n-type source region 41a is etched from the surface side of the n-type source region 41a, so that a trench 31 is formed to pass through the p-type semiconductor layer 13 to reach the n-type semiconductor layer 12, and further an insulating layer 32 is formed on the inner wall of the trench 31 as shown in FIG. 7C (Process 5). The formation of the trench 31 allows an n-type source region 41 to be formed.

Figure 7D:
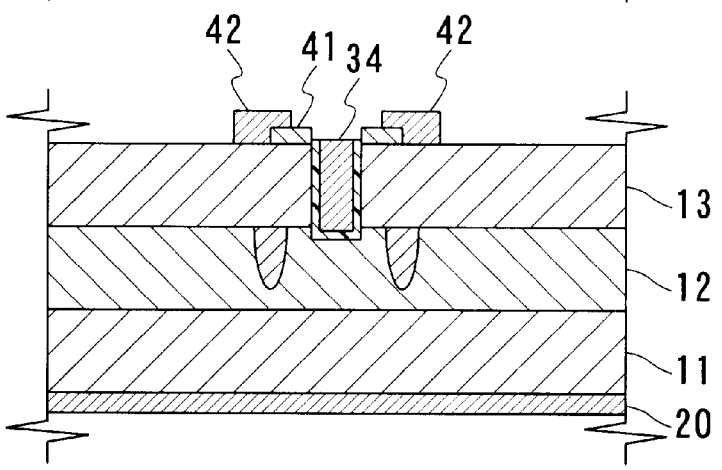
Figure 8A:
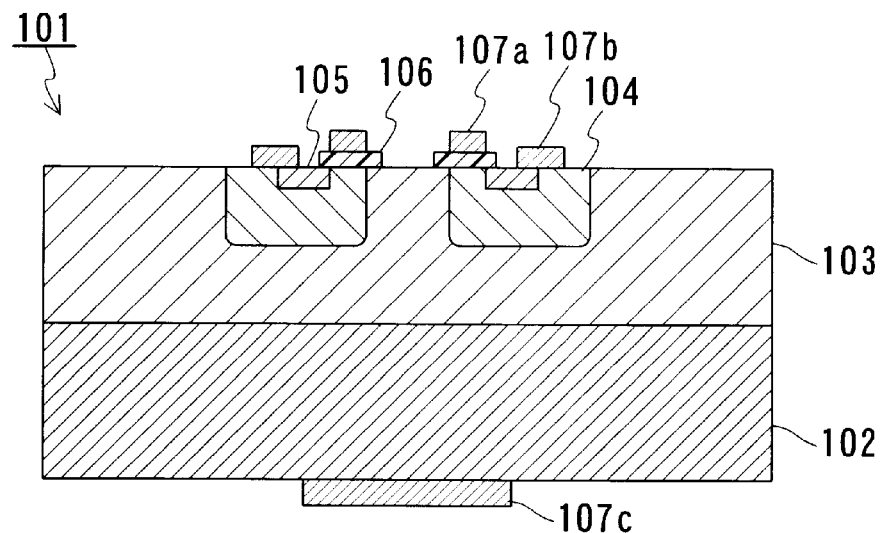
FIGS. 8A and 8B show sectional views of examples of conventional field effect transistors.
Figure 8B:
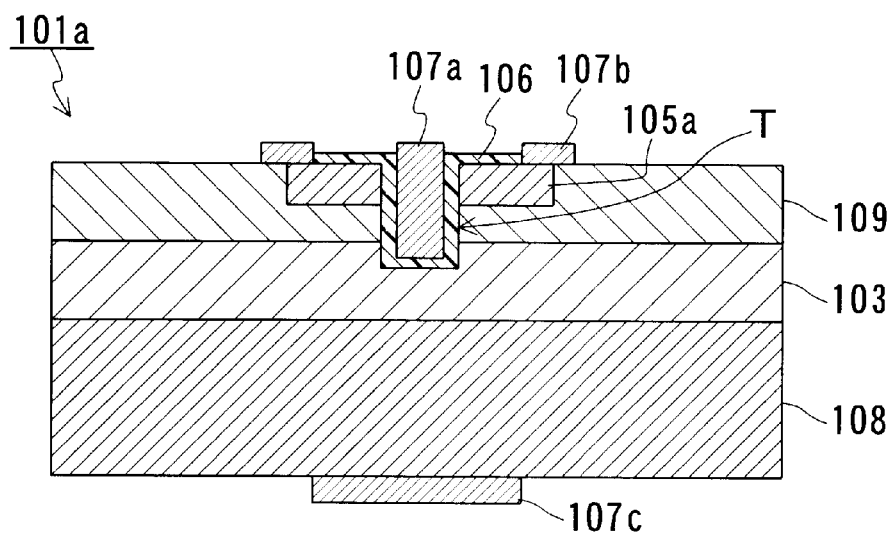
Figure 9:
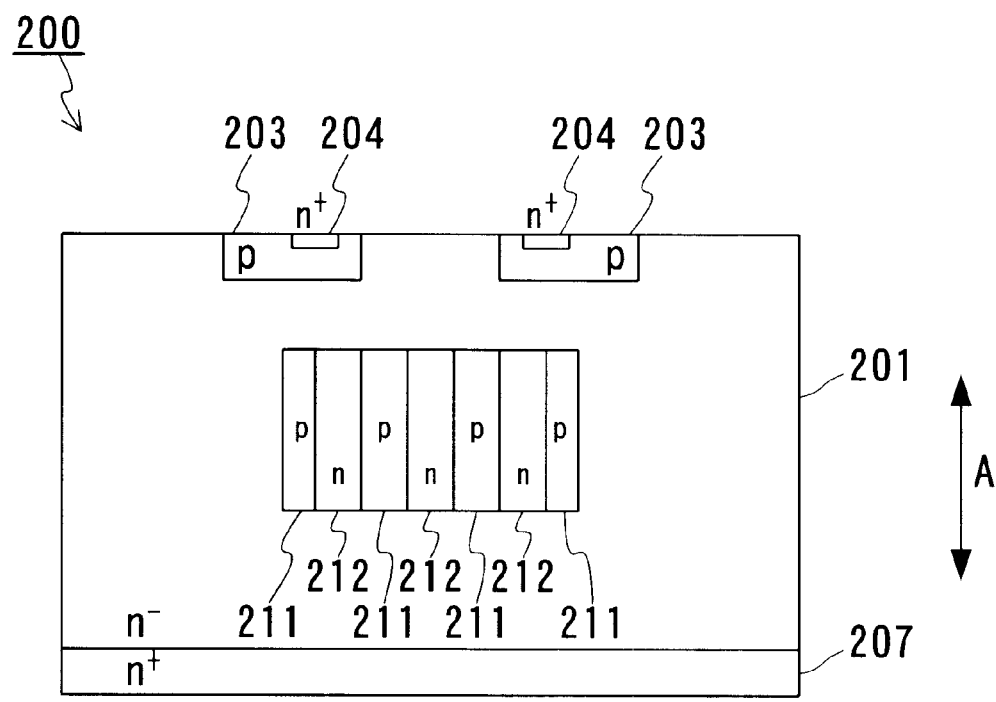
FIG. 9 is a sectional view showing still another example of a conventional field effect transistor.

Then, as shown in FIG. 7D, a gate electrode 34 is formed to be disposed on the insulating layer 32, a source electrode 42 to be disposed to be in contact with the n-type source region 41, and a drain electrode 20 to be disposed on the rear surface of the substrate 11 (Process 6). Thus, a field effect transistor can be manufactured.

According to the manufacturing method of Embodiment 6, the FET 40 described in Embodiment 3 can be manufactured easily.

EXAMPLES

The present invention is described further in detail using examples as follows.

Example 1

In Example 1, an example of manufacturing the FET 10 by the manufacturing method described in Embodiment 4 is described with reference to FIGS. 5A to 5D.

Initially, a SiC substrate (the substrate 11) was prepared, which was obtained by off-cutting of a Si plane of an n-type 6H-SiC(0001) toward the [11-20] direction by a tilt angle of 4 degrees. This SiC substrate had been doped with nitrogen at a concentration of $3 \times 10^{18}$ cm$^{-3}$. Then, the surface of the SiC substrate was washed. Afterward, an n-type epitaxial layer (the n-type semiconductor layer 12) doped with nitrogen at a concentration of $1.3 \times 10^{16}$ cm$^{-3}$ was formed on the surface of the SiC substrate by the CVD method to have a thickness of 7 μm.

Next, a metal mask was formed on the surface of the n-type epitaxial layer. Boron ions with seven different ion energy levels selected from the range of 0.9 MeV to 7.0 MeV were implanted in a dose of $3 \times 10^{14}$ cm$^{-2}$. According to this process, a p-type region 14 with a depth of about 3 μm was formed (see FIG. 5A). The p-type region 14 was formed to have a doughnut shape with an outer diameter of 23 μm and an inner diameter of 13 μm.

Next, a p-type epitaxial layer (the p-type semiconductor layer 13) doped with Al at a concentration of $1 \times 10^{16}$ cm$^{-3}$ was formed on the n-type epitaxial layer by the CVD method (see FIG. 5B). The p-type epitaxial layer had a thickness of 2 μm. In this state, the substrate had a temperature of 1600° C., and thus the p-type region 14 formed by the ion implantation was activated during the formation of the p-type epitaxial layer. The p-type region 14 may be activated by a heat treatment in an inert gas containing a small amount of silane at a temperature of at least 1500° C. before the formation of the p-type epitaxial layer.

Next, a metal mask was formed on the surface of the p-type epitaxial layer. Nitrogen ions with seven different ion energy levels selected from the range of 0.9 MeV to 6.0 MeV were implanted in a dose of $3 \times 10^{14}$ cm$^{-2}$ at a substrate temperature of 500° C. Thus, an n-type region 15 was formed (see FIG. 5C). The position of the n-type region 15 corresponds to the position of the opening at the center of the p-type region 14 with the doughnut shape. The n-type region 15 was formed to have a surface having a circular shape with a diameter of 12 μm. According to this process, the n-type region 15 with a depth of at least 2 μm was formed. In other words, the n-type region 15 passed through the p-type epitaxial layer (the p-type semiconductor layer 13) to reach the n-type epitaxial layer (the n-type semiconductor layer 12) and had electrical continuity with the n-type epitaxial layer.

Subsequently, another metal mask was formed on the p-type epitaxial layer and nitrogen ions with an energy of 20 keV were implanted in the p-type epitaxial layer in a dose of $5 \times 10^{15}$ cm$^{-2}$ at a substrate temperature of 500° C. Thus, an n-type source region 16 was formed (see FIG. 5C). The n-type source region 16 was formed to have a doughnut shape with an outer diameter of 26 μm and an inner diameter of 16 μm. The n-type source region 16 was formed so that the n-type region 15 is disposed inside the inner circle of the n-type source region 16. Then, the substrate in which the nitrogen ions had been implanted was heat-treated in an Ar atmosphere at 1500° C. for one hour, so that the regions subjected to the ion implantation were activated. Thus, the n-type region 15 and the n-type source region 16 were completed. In the field effect transistor according to Example 1, a channel region 21 (see FIG. 1A) had a length of 2 μm.

Next, the SiC substrate was introduced into an oxidation oven and was subjected to wet oxidation at 1100° C. for three hours. Thus, the surfaces of the SiC substrate and the semiconductor layer were oxidized and thereby a silicon oxide layer with a thickness of 40 nm was formed.

Subsequently, an unwanted portion of the silicon oxide layer was removed by photolithographic etching, and a Ni ohmic electrode was deposited and then was heat-treated. Thus, a source electrode 19 and a drain electrode 20 were formed. Furthermore, a gate electrode 18 made of polysilicon was formed on the silicon oxide layer (the insulating layer 17). The gate electrode 18 was formed to have a doughnut shape with an outer diameter of 16 μm and an inner diameter of 11 μm. The source electrode 19 also was formed to have a doughnut shape with an outer diameter of 30 μm and an inner diameter of 20 μm.

The present example employed the SiC substrate obtained by off-cutting of a Si plane of a 6H-SiC(0001) toward the [11–20] direction by a tilt angle of 4 degrees. Instead of this SiC substrate, the following substrates with a Si plane also may be used: a β-SiC(111) substrate, a 6H α-SiC(0001) substrate, a 4H α-SiC(0001) substrate, a 15R-SiC substrate, or substrates with planes obtained by off-cutting of the Si planes thereof by a tilt angle within 10 degrees (the same holds true in the following examples). In addition, the following substrates also may be used: a β-SiC(100) substrate, a β-SiC(110) substrate, a 6H α-SiC(0001) substrate, a 4H α-SiC(0001) substrate, an α-SiC(1-100) substrate, an α-SiC(11-20) substrate, or substrates with planes obtained by off-cutting of the planes thereof by a tilt angle within 15 degrees (the same holds true in the following examples).

In Example 1, the n-type source region was formed by ion implantation, but may be formed through epitaxial growth as described in Embodiment 6.

In Example 1, the descriptions with respect to ion implantation were directed to the cases of the multilevel-energy ion implantation with seven different ion energy levels selected from the range of 0.9 MeV to 7.0 MeV and the ion implantation with an energy of 20 keV. However, the ion implantation is not limited to them and can be carried out with an energy within the range of 1 keV to 10 MeV (the same holds true in the following examples). Particularly, when at least two different energy levels are selected from the energy range described above and the multilevel-energy ion implantation is carried out, a box profile with a substantially uniform dopant distribution can be formed (the same holds true in the following examples). In the n-type or p-type region formed by the multilevel-energy ion implantation, its part with a thickness of about 1 μm measured from its surface may have a lower doping concentration. Therefore, when the part is removed by RIE etching, a better result can be obtained (the same holds true in the following examples).

In Example 1, the SiC substrate was maintained at 500° C. during the ion implantation. However, the temperature is not limited to this. When the SiC substrate is maintained at 300° C. or higher, damages caused by the ion implantation can be annealed to some degree during the ion irradiation and thus a FET of the present invention can be manufactured (the same holds true in the following examples).

Furthermore, in Example 1, the silicon oxide layer formed by the wet oxidation of the SiC substrate at 1100° C. was used as the gate insulating layer (the insulating layer 17). Instead of the silicon oxide layer, however, the following layers may be used: for example, a silicon oxide layer formed by the CVD method, an insulating oxide layer such as an aluminum oxide layer, a ferroelectric layer, or an insulating nitride layer.

In Example 1, the p-type region 14, the n-type region 15, and the n-type source region 16 were formed in a doughnut or circular shape, but may be formed in a hexagonal shape.

Moreover, the description in Example 1 was directed to the FET in which the channel region was formed of the p-type semiconductor and the carrier moving in the channel region was electrons. However, the same effect was obtained in a FET manufactured to have a hole as the carrier and n-type and p-type semiconductors replaced with the p-type and n-type semiconductors in the FET according to Example 1, respectively (the same holds true in the following examples).

The field effect transistor described in Example 1 had a withstand voltage of at least 600 V. In addition, when the field effect transistors produced according to Example 1 were arranged in parallel in a 100×100 matrix form, a MOSFET with a high withstand voltage and low loss was obtained that has a low resistance in an on state, namely not higher than 100 mΩ.

Example 2

In Example 2, an example of manufacturing the FET 30 according to the manufacturing method described in Embodiment 5 is described with reference to FIGS. 6A to 6D.

Initially, a SiC substrate (the substrate 11) was prepared, which was obtained by off-cutting of a Si plane of an n-type 6H-SiC(0001) toward the [11–20] direction by a tilt angle of 4 degrees. This SiC substrate had been doped with nitrogen at a concentration of $3\times10^{18}$ cm$^{-3}$. Then, the surface of the SiC substrate was washed. Afterward, an n-type epitaxial layer (the n-type semiconductor layer 12) doped with nitrogen at a concentration of $1.3\times10^{16}$ cm$^{-3}$ was formed on the surface of the SiC substrate by the CVD method to have a thickness of 7 μm.

Next, a metal mask was formed on the surface of the n-type epitaxial layer. Boron ions with seven different ion energy levels selected from the range of 0.9 MeV to 7.0 MeV were implanted in a dose of $3\times10^{14}$ cm$^{-2}$. According to this process, a p-type region 14 with a depth of about 3 μm was formed (see FIG. 6A). The p-type region 14 was formed to have a doughnut shape with an outer diameter of 23 μm and an inner diameter of 13 μm.

Next, a p-type epitaxial layer (the p-type semiconductor layer 13) doped with Al at a concentration of $1\times10^{16}$ cm$^{-3}$ was formed on the n-type epitaxial layer by the CVD method to have a thickness of 2 μm (see FIG. 6A). In this state, the substrate had a temperature of 1600° C. Accordingly, the p-type region 14 formed by ion implantation was heat-treated during the growth of the p-type epitaxial layer and thus was activated. Before the formation of this p-type epitaxial layer, the p-type region 14 may be activated by an heat treatment in an inert gas containing a small amount of silane at a temperature of at least 1500° C.

Next, a metal mask was formed on the p-type epitaxial layer. Nitrogen ions with an energy of 20 keV were implanted in the p-type epitaxial layer in a dose of $5\times10^{15}$ cm$^{-2}$ at a substrate temperature of 500° C. Thus, an n-type source region 33a was formed. The n-type source region 33a was formed to have a doughnut shape with an outer diameter of 19 μm and an inner diameter of 9 μm or smaller. The n-type source region 33a was formed in a place allowing the inner circle of the n-type source region 33a to be included in the inner circle of the p-type region 14. The n-type source region 33a may be formed not in a doughnut shape but in a circular shape. Then, the substrate in which the nitrogen ions had been implanted was heat-treated in an Ar atmosphere at 1500° C. for one hour, so that the regions subjected to the ion implantation were activated. Thus, the n-type source region 33a was completed.

Subsequently, the p-type epitaxial layer was etched from its surface and thus a trench 31 was formed to pass through the p-type epitaxial layer to reach the n-type epitaxial layer (see FIG. 6B). The trench 31 was formed so that its bottom surface 31a has a circular shape with a diameter of 9 μm whose center coincides with that of the doughnut-shaped p-type region 14.

In addition, the trench 31 was formed so that its side wall 31b has an angle close to a right angle (at least 75 degrees) with respect to the surface of the p-type epitaxial layer.

Next, the SiC substrate was introduced into an oxidation oven and was subjected to wet oxidation at 1100° C. for three hours. Thus, the surfaces of the SiC substrate and the semiconductor layer were oxidized and thereby an insulating layer made of silicon oxide with a thickness of at least 40 nm was formed. Consequently, the insulating layer 32 was formed to cover the inner wall of the trench 31. In this case, the insulating layer 32 on the side wall of the trench 31 had a thickness of about 100 nm.

Next, an unwanted portion of the silicon oxide layer was removed by photolithographic etching, and a Ni ohmic electrode was deposited and then was heat-treated. Thus, a source electrode 19 and a drain electrode 20 were formed. In this case, the source electrode 19 was formed to contact with the p-type epitaxial layer (the p-type semiconductor layer 13) and the n-type source region 33. The source electrode 19 had a doughnut shape with an outer diameter of 26 μm and an inner diameter of 14 μm, which is larger than that of the opening of the trench 31. Furthermore, a gate electrode 34 of polysilicon was formed on the insulating layer 32 to be fitted in the trench 31. Thus, a field effect transistor according to the present invention was produced.

In the field effect transistor of Example 2, the length of the channel region 35 (see FIG. 3A) corresponds to that obtained through subtraction of the thickness of the n-type source region 33 from the thickness of the p-type epitaxial layer, namely about 1.9 μm.

In Example 2, the n-type source region was formed by the ion implantation, but may be formed by the epitaxial growth as described in Embodiment 6.

In Example 2, the silicon oxide layer formed by the wet oxidation of the SiC substrate at 1100° C. was used as the gate insulating layer (the insulating layer 32). Instead of the silicon oxide layer, however, the following layers may be used: for example, a silicon oxide layer formed by the CVD method, an insulating oxide layer such as an aluminum oxide layer, a ferroelectric layer, or an insulating nitride layer. In this case, when the thickness of the gate insulating layer was set to be 200 nm or thinner, an excellent MOSFET operation was obtained.

In Example 2, the p-type region 14 and the n-type source region 33 were formed in a doughnut or circular shape, but may be formed in a hexagonal shape.

The field effect transistor described in Example 2 had a withstand voltage of at least 600 V. In addition, when field effect transistors produced according to Example 2 were arranged in parallel in a 100×100 matrix form, a MOSFET with a high withstand voltage and low loss was obtained that has a low resistance in an on state, namely not higher than 100 mΩ.

Example 3

In Example 3, an example of manufacturing the FET 40 according to the manufacturing method described in Embodiment 6 is described with reference to FIGS. 7A to 7D.

Initially, a SiC substrate (the substrate 11) was prepared, which was obtained by off-cutting of a Si plane of an n-type 6H-SiC(0001) toward the [11-20] direction by a tilt angle of 4 degrees. This SiC substrate had been doped with nitrogen at a concentration of $3\times10^{18}$ cm$^{-3}$. Then, the surface of the SiC substrate was washed. Subsequently, an n-type epitaxial layer (the n-type semiconductor layer 12) doped with nitrogen at a concentration of $1.3\times10^{16}$ cm$^{-3}$ was formed on the surface of the SiC substrate by the CVD method to have a thickness of 7 μm.

Next, a metal mask was formed on the surface of the n-type epitaxial layer. Boron ions with seven different ion energy levels selected from the range of 0.9 MeV to 7.0 MeV were implanted in a dose of $3\times10^{14}$ cm$^{-2}$. According to this process, a p-type region 14 with a depth of about 3 μm was formed (see FIG. 7A). The p-type region 14 was formed to have a doughnut shape with an outer diameter of 23 μm and an inner diameter of 13 μm.

Next, a p-type epitaxial layer (the p-type semiconductor layer 13) doped with Al at a concentration of $1\times10^{16}$ cm$^{-3}$ was formed on the n-type epitaxial layer by the CVD method to have a thickness of 2 μm (see FIG. 7A). In this state, the substrate had a temperature of 1600° C. Accordingly, the p-type region 14 formed by the ion implantation was heat-treated during the growth of the p-type epitaxial layer and thus was activated.

Subsequently, an n-type epitaxial layer doped with nitrogen at a concentration of $1\times10^{19}$ cm$^{-3}$ was formed on the p-type epitaxial layer. Then, a part of this n-type epitaxial layer was removed by photolithographic and etching processes. Thus, an n-type source region 41a having a circular shape with a diameter of 19 μm was formed (see FIG. 7A).

Next, the n-type source region 41a was etched from its surface, so that a trench 31 was formed to pass through the p-type epitaxial layer to reach the n-type epitaxial layer (see FIG. 7B). The trench 31 was formed so that its bottom surface 31a has a circular shape with a diameter of 9 μm whose center coincides with that of the doughnut-shaped p-type region 14. In addition, the trench 31 was formed so that its side wall 31b has an angle close to a right angle (at least 75 degrees) with respect to the surface of the p-type epitaxial layer.

Next, the SiC substrate was introduced into an oxidation oven and was subjected to wet oxidation at 1100° C. for three hours. Thus, the surfaces of the SiC substrate and the semiconductor layer were oxidized and thereby an insulating layer of silicon oxide with a thickness of at least 40 nm was formed. Thus, the insulating layer 32 was formed to cover the inner wall of the trench 31.

Then, an unwanted portion of the silicon oxide layer was removed by photolithographic etching, and a Ni ohmic electrode was deposited and then was heat-treated. Thus, a source electrode 42 and a drain electrode 20 were formed. In this case, the source electrode 42 was formed to contact with the p-type epitaxial layer (the p-type semiconductor layer 13) and the n-type source region 41. In addition, the source electrode 42 had a doughnut shape with an outer diameter of 26 μm and an inner diameter of 14 μm, which is larger than that of the opening of the trench 31. Furthermore, a gate electrode 34 of polysilicon was formed on the insulating layer 32 to be fitted in the trench 31. Thus, a field effect transistor according to the present invention was produced.

In the field effect transistor of Example 3, the length of the channel region 35 (see FIG. 4A) corresponds to the thickness of the p-type epitaxial layer, namely about 2 μm.

In Example 3, the p-type region 14 and the n-type source region 41 were formed in a doughnut or circular shape, but may be formed in a hexagonal shape.

The field effect transistor described in Example 3 had a withstand voltage of at least 600 V. In addition, when field effect transistors produced according to Example 3 were arranged in parallel in a 100×100 matrix form, a MOSFET with a high withstand voltage and low loss was obtained that has a low resistance in an on state, namely not higher than 100 mΩ.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A field effect transistor, comprising:
   an n-type semiconductor layer;
   a p-type semiconductor layer formed on the n-type semiconductor layer;
   a p-type region embedded in the n-type semiconductor layer to be in contact with the p-type semiconductor layer;
   a drain electrode electrically connected to the n-type semiconductor layer;
   an n-type source region disposed in contact with the p-type semiconductor layer;
   an n-type region passing through the p-type semiconductor layer to reach the n-type semiconductor layer;
   an insulating layer disposed adjacent to the p-type semiconductor layer; and
   a gate electrode disposed on the insulating layer,
       wherein the n-type semiconductor layer, the p-type semiconductor layer, and the p-type region respectively are made of wide-gap semiconductors with a bandgap of at least 2 eV;
       a depletion region is formed so as to completely block an electron conduction path during an off state;
       the n-type source region is disposed in a surface portion of the p-type semiconductor layer and around the n-type region, and a portion of the n-type source region other than its surface is surrounded by the p-type semiconductor layer,
       the gate electrode is disposed in a place corresponding to that of a portion of the p-type semiconductor layer between the n-type region and the n-type source region with the insulating layer interposed between the gate electrode and the portion of the p-type semiconductor layer, and
       the p-type region is disposed around the n-type region.

2. The field effect transistor according to claim 1, wherein the wide-gap semiconductor is SiC.

3. The field effect transistor according to claim 2, further comprising a substrate made of SiC,
   wherein the n-type semiconductor layer is formed on the substrate, and the substrate is a β-SiC(100) substrate, a β-SiC(110) substrate, a 6H α-SiC(1-100) substrate, a 4H α-SiC(1-100) substrate, an α-SiC(11-20) substrate, or one of substrates with planes obtained by off-cutting of planes thereof by a tilt angle within 15 degrees, or is one of the following substrates with a Si plane: a β-SiC(111) substrate, a 6H α-SiC(0001) substrate, a 4H α-SiC(0001) substrate, a 15R-SiC substrate, and substrates with planes obtained by off-cutting of the Si planes thereof by a tilt angle within 10 degrees.

4. The field effect transistor according to claim 1, further comprising a trench passing through the p-type semiconductor layer to reach the n-type semiconductor layer,
   wherein the insulating layer is disposed on at least a side wall of the trench,
   the n-type source region is disposed in a surface portion of the p-type semiconductor layer and around the insulating layer, and
   the p-type region is disposed around the trench.

5. The field effect transistor according to claim 4, wherein the insulating layer disposed on the side wall has a mean thickness not exceeding 500 nm.

6. The field effect transistor according to claim 1, wherein a total of a mean thickness of the n-type semiconductor layer and a mean thickness of the p-type semiconductor layer does not exceed 20 μm.

7. The field effect transistor according to claim 1, wherein the p-type region has a depth not exceeding 10 μm.

8. A field effect transistor, comprising:
   an n-type semiconductor layer;
   a p-type semiconductor layer formed on the n-type semiconductor layer;
   a p-type region embedded in the n-type semiconductor layer to be in contact with the p-type semiconductor layer;
   a drain electrode electrically connected to the n-type semiconductor layer;
   an n-type source region disposed in contact with the p-type semiconductor layer;
   an insulating layer disposed adjacent to the p-type semiconductor layer;
   a gate electrode disposed on the insulating layer, and
   an n-type region passing through the p-type semiconductor layer to reach the n-type semiconductor layer,
       wherein the n-type semiconductor layer, the p-type semiconductor layer, and the p-type region respectively are made of wide-gap semiconductors with a bandgap of at least 2 eV,
       the n-type source region is disposed in a surface portion of the p-type semiconductor layer and around the n-type region, and a portion of the n-type source region other than its surface is surrounded by the p-type semiconductor layer,
       the gate electrode is disposed in a place corresponding to that of a portion of the p-type semiconductor layer between the n-type region and the n-type source region with the insulating layer interposed between the gate electrode and the portion of the p-type semiconductor layer, and
       the p-type region is disposed around the n-type region.

* * * * *